United States Patent [19]

Braun

[11] Patent Number: 4,616,179
[45] Date of Patent: Oct. 7, 1986

[54] METHOD OF MEASURING TORQUE OF AN AC MOTOR

[75] Inventor: Dennis H. Braun, Brookfield, Wis.

[73] Assignee: Eaton Corporation, Cleveland, Ohio

[21] Appl. No.: 609,459

[22] Filed: May 11, 1984

[51] Int. Cl.$^4$ .............................................. G01L 3/00
[52] U.S. Cl. ........................... 324/158 MG; 318/805; 324/107; 364/483
[58] Field of Search ............... 324/107, 158 MG, 142; 318/805, 803, 490, 455; 310/68 B; 364/492, 494, 511, 483; 361/30

[56] References Cited

U.S. PATENT DOCUMENTS

| | | | |
|---|---|---|---|
| 4,245,181 | 1/1981 | Plunkett | 324/158 MG X |
| 4,419,625 | 12/1983 | Béjot et al. | 324/158 MG X |
| 4,431,957 | 2/1984 | Chausse et al. | 318/805 |
| 4,442,393 | 4/1984 | Abbondanti | 324/158 MG X |
| 4,470,000 | 9/1984 | Heinle | 318/805 |

FOREIGN PATENT DOCUMENTS 58-139662  8/1983  Japan .......................... 324/158 MG

OTHER PUBLICATIONS

Pospisil, J., "Practical Verification of Motor Speed–Torque Characteristics", IEEE 1978 Power Eng. Soc. Winter Mtg.

Primary Examiner—Reinhard J. Eisenzopf
Assistant Examiner—Stephen M. Baker
Attorney, Agent, or Firm—Andrus, Sceales, Starke & Sawall

[57] ABSTRACT

A method is provided for measuring the torque of an AC motor (4) without a mechanical transducer by sensing input voltage, and input current regardless of phase, and determining the torque therefrom.

3 Claims, 1 Drawing Figure

METHOD OF MEASURING TORQUE OF AN AC MOTOR

BACKGROUND AND SUMMARY

The invention relates to a method for measuring the torque of an AC motor, including a three phase motor.

One known manner of measuring the torque of an AC motor is by means of a mechanical torque transducer coupled to the output shaft of the motor.

In another known torque measurement technique, the component of the input current to the motor which is in-phase with the input voltage is measured. The torque of the motor is determined from this in-phase current component by assuming a roughly linear relation; or by empirically determined correspondence to known torque values, which values may have been predetermined for example by means of a mechanical torque transducer as plotted against various values of in-phase input current. This method affords only a rough approximation. The method also requires input discrimination circuitry discriminating against input current which is out-of-phase relative to the input voltage, to thus insure that only in-phase current components are measured.

The present invention provides a method for measuring torque of an AC motor which addresses and solves the above noted and other problems. Torque is measured from the sensed parameters of input voltage and current to the motor. The current is sensed regardless of its phase relative to the voltage, i.e. without discrimination against out-of-phase components. In preferred form, a method is provided for measuring the instantaneous signature torque waveform of a three-phase AC motor. The method requires no advance empirical plotting of data or the like.

BRIEF DESCRIPTION OF THE DRAWINGS

The signal drawing is a schematic circuit diagram illustrating a torque measurement system in accordance with the invention.

DETAILED DESCRIPTION

Figure 1:
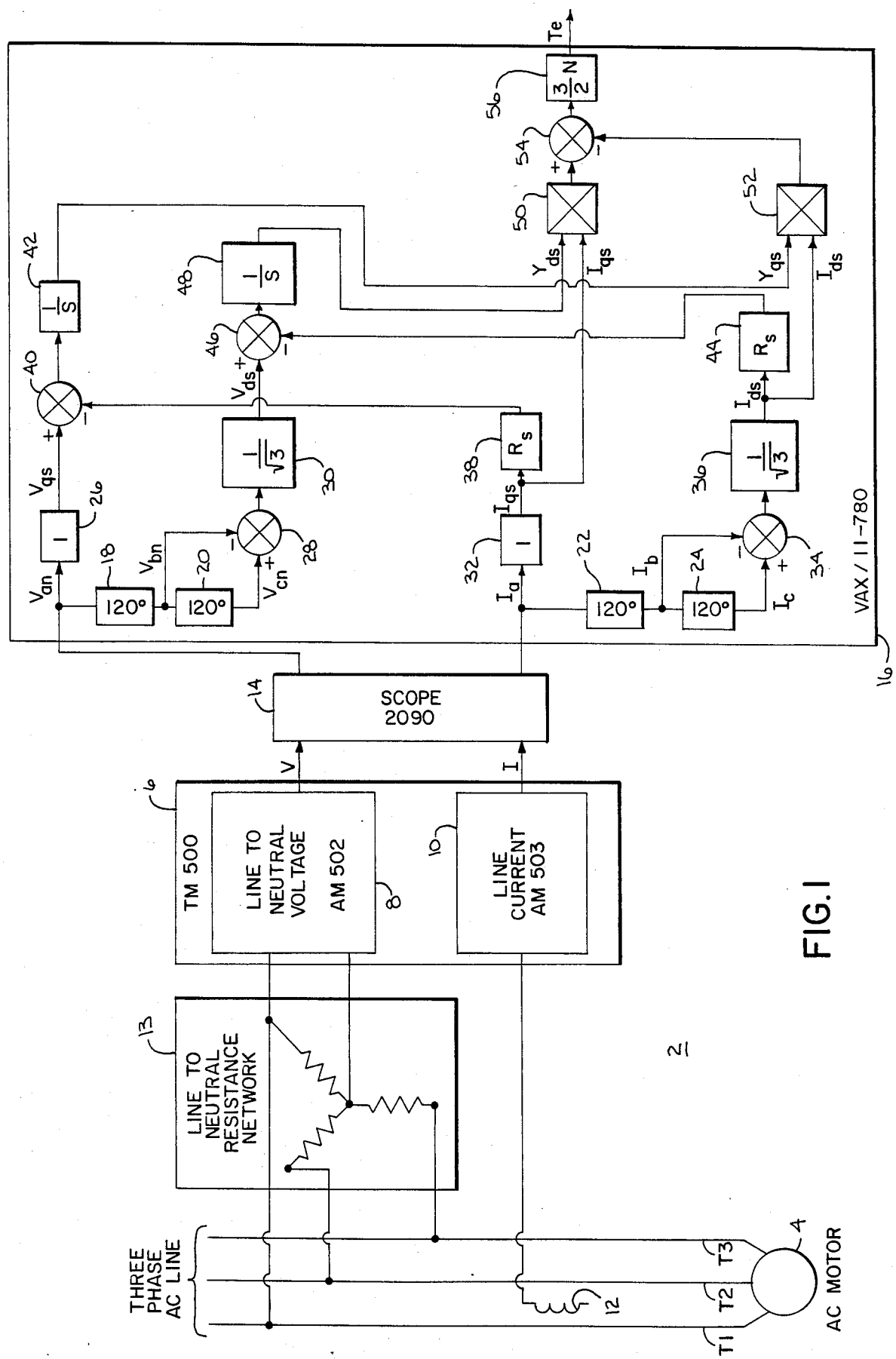

Referring to FIG. 1, a system 2 is provided for measuring the torque of a three-phase AC motor 4 having three respective input lines $T_1$, $T_2$ and $T_3$. The instantaneous signature torque waveform is measured over a given interval of at least one full AC cycle. Means are provided for sensing the input voltage and current to the motor, such as Tektronix TM500 interface instrumentation 6 including an AM502 differential preamplifier 8 having a zero to one MHz bandwidth for voltage measurement and an AM503 current probe amplifier 10 with a 100 ampere current probe 12 for current measurement. All the line current during the given interval is sensed, both in-phase and out-of-phase with the input voltage. There is no discrimination against out-of-phase current components relative to the voltage. Differential preamplifier 8 senses line to neutral voltage in known manner by the voltage from the line to neutral resistance network 13, for example a Y connected resistance network. The motor terminal voltage and input current are measured for at least one full AC cycle.

A model 2090 Nicolet digital oscilloscope 14 digitizes the live analog voltage and current from sensors 8 and 10 to convert the values thereof into a plurality of digital data points in an array with 12 bit sensitivity. It is preferred that the torque be determined with the aid of a computer, and oscilloscope 14 communicates with a VAX/11-780, Digital Equipment Corp., minicomputer 16. The data for a given interval, at least one full AC cycle, is recorded by oscilloscope 14 and transmitted to computer 16. In the particular configuration shown, the data array has a maximum range of 2048 points of voltage and simultaneous current versus time for the "a" phase of line $T_1$.

Minicomputer 16 is operated in accordance with the program in the appendix. The line to neutral voltage $V_{an}$ data array is phase shifted in time by 120° at 18 and 20 to produce the other two line to neutral voltages $V_{bn}$ and $V_{cn}$ of respective lines $T_2$ and $T_3$. The line current $I_a$ data array is also phase shifted in time by 120° and 22 and 24 to produce the other two line currents $I_b$ and $I_c$ for respective lines $T_2$ and $T_3$.

The quadrature and direct voltage data arrays $V_{qs}$ and $V_{ds}$ are determined from the line voltage arrays $V_{an}$, $V_{bn}$ and $V_{cn}$ in accordance with equations 1 and 2, $$V_{qs} = V_{an} \qquad \text{(equation 1)}$$

$$V_{ds} = \frac{1}{\sqrt{3}} (V_{cn} - V_{bn}) \qquad \text{(equation 2)}$$

as shown at unity multiplier 26 for equation 1, and summer 28 and multiplier 30, by the factor the inverse of the square root of 3, for equation 2. The quadrature and direct current data arrays $I_{qs}$ and $I_{ds}$ are determined from the line current arrays $I_a$, $I_b$ and $I_c$ in accordance with equations 3 and 4, $$I_{qs} = I_a \qquad \text{(equation 3)}$$

$$I_{ds} = \frac{1}{\sqrt{3}} (I_c - I_b) \qquad \text{(equation 4)}$$

as shown at unity multiplier 32 for equation 3, and summer 34 and factor multiplier 36 for equation 4.

The quadrature stator flux linkage $Y_{qs}$ is determined from the quadrature voltage data array $V_{qs}$, the quadrature current data array $I_{qs}$ and the stator resistance $R_s$ of the motor in accordance with equation 5, $$pY_{qs} = V_{qs} - I_{qs}R_s \qquad \text{(equation 5)}$$

as shown at multiplier 38 generating the IR drop, and summer 40 yielding the V−IR difference followed by time integration at 42. In equation 5, "p" is the time derivative, and thus $Y_{qs}$ is equal to the integral of $(V_{qs} - I_{qs}R_s)$. The integrand data array is generated by the point by point integration of equation 5. This point by point integration for the quadrature stator flux linkage $Y_{qs}$ is determined by the known trapezoidal method of integration. The direct stator flux linkage $Y_{ds}$ is determined from the direct voltage data array $V_{ds}$, the direct current data array $I_{ds}$ and the stator resistance $R_s$ in accordance with equation 6, $$pY_{ds} = V_{ds} - I_{ds}R_s \qquad \text{(equation 6)}$$

as shown at factor multiplier 44, summer 46 and 1/p, shown as 1/S integrator 48. $Y_{ds}$ is determined point by point integration, comparably to $Y_{qs}$.

A point by point data array of the electromagnetic torque $T_e$ is determined from the direct and quadrature currents $I_{ds}$, $I_{qs}$, and stator flux linkages $Y_{ds}$, $Y_{qs}$, and the number N of poles of the motor, in accordance with equation 7, $$T_e = (3/2)N(Y_{ds}I_{qs} - Y_{qs}I_{ds}) \quad \text{(equation 7)}$$

as shown at multipliers 50 and 52, summer 54 and factor multiplier 56.

Equations 1-7 are known in the art, and are based on the per phase equivalent, lumped parameter, circuit of an induction motor. The average value of the $V_{an}$, $I_a$, $Y_{qs}$ and $Y_{ds}$ waveforms or data arrays may be calculated and removed from the data. While it is preferred that the instantaneous signature torque waveform be measured, the average value of the torque over a given interval of at least one full AC cycle may also be measured by calculating the average value of the signature torque waveform over the interval.

It is recognized that various modifications are possible within the scope of the appended claims.

I claim:

1. A method of measuring torque of an AC motor comprising:
    sensing input voltage to said motor;
    sensing input current to said motor without discrimination against out-of-phase components relative to said voltage; and
    calculating said torque from said sensed input voltage and current;
    wherein said input voltage and current are sensed for at least one full AC cycle, said input current being sensed regardless of its phase relative to said input voltage;
    wherein said AC motor is a three-phase motor with three respective input lines, and comprising:
    sensing the line to neutral voltage of one of said input lines;
    phase shifting in time said sensed voltage of said one input line to yield the other two line to neutral voltages of the other two input lines;
    sensing the line current of one of said input lines;
    phase shifting in time said sensed current of said one input line to yield the other two line currents of the other two input lines;
    determining direct and quadrature voltages from said line to neutral voltages;
    determining direct and quadrature currents from said line currents;
    determining direct and quadrature stator flux linkages from said direct and quadrature voltages and currents; and
    determining torque from said direct and quadrature currents and stator flux linkages.

2. A method for measuring the instantaneous signature torque waveform of an AC motor comprising:
    sensing input voltage to said motor over a given interval, and converting the values of the sensed input voltage to an array of digital data;
    sensing input current to said motor over said given interval without discrimination against out-of-phase components relative to said voltage, and converting the values of said sensed input current to an array of digital data;
    calculating said instantaneous signature torque waveform point by point from said digital data arrays of said sensed input voltage and current;
    wherein said AC motor is a three-phase motor with three respective input lines, given stator resistance and given number of poles, and comprising:
    sensing the live analog line to neutral voltage waveform of one of said input lines for at least one full AC cycle;
    converting the sensed analog input voltage waveform to a representative plurality of digital data points in an array;
    sensing the live analog line current waveform of one of said input lines over said given interval;
    converting the sensed analog line current waveform into a plurality of digital data points in an array;
    phase shifting in time said voltage data array to produce the other two line to neutral voltages of the other two input lines in respective digital data arrays for the waveforms thereof;
    phase shifting in time said current data array of said one input line to produce the other two line currents of the other two input lines in respective digital data arrays of the waveforms thereof;
    determining direct and quadrature voltage data arrays from said line to neutral volage data arrays;
    determining direct and quadrature current data arrays from said line current data arrays;
    determining direct and quadrature stator flux linkage data arrays by integrating point by point the differences between respective direct and quadrature voltage data arrays and the products of said stator resistance and respective direct and quadrature current data arrays; and
    determining said signature torque waveform from the summation of the product of said direct stator flux linkage and quadrature current and the product of said quadrature stator flux linkage and direct current, factored by said number of poles.

3. A method for measuring torque of an AC motor comprising:
    sensing input voltage to said motor over a given interval, and converting the values of the sensed input voltage to an array of digital data;
    sensing input current to said motor over said given interval without discrimination against out-of-phase components relative to said voltage, and converting the values of said sensed input current to an array of digital data;
    calculating said instantaneous signature torque waveform point by point from said digital data arrays of said sensed input voltage and current;
    wherein said motor is a three-phase motor with three respective input lines and having a given stator resistance and given number of poles, and comprising:
    sensing the line to neutral voltage of one of said input lines;
    phase shifting in time said sensed voltage of said one input line to yield the other two line to neutral voltages of the other two input lines;
    sensing the line current of one of said input lines;
    phase shifting in time said sensed current to said one input line to yield the other two line currents of the other two input lines;
    determining direct and quadrature voltages from said line to neutral voltages;
    determining direct and quadrature currents from said line currents;
    determining direct and quadrature stator flux linkages from said stator resistance and said direct and quadrature voltages and currents;
    determining torque from said number of poles and said direct and quadrature currents and stator flux linkages.

* * * * *